(12) United States Patent
Volant et al.

(10) Patent No.: US 6,368,484 B1
(45) Date of Patent: Apr. 9, 2002

(54) SELECTIVE PLATING PROCESS

(75) Inventors: Richard P. Volant, New Fairfield, CT (US); Peter S. Locke, Hopewell Junction; Kevin S. Petrarca, Newburgh, both of NY (US); David M. Rockwell, Susquehanna, PA (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/567,468

(22) Filed: May 9, 2000

(51) Int. Cl.[7] .................................................. C25D 5/48
(52) U.S. Cl. ....................... 205/220; 205/221; 205/223; 438/687
(58) Field of Search ................................ 205/220, 221, 205/223; 438/687

(56) References Cited

U.S. PATENT DOCUMENTS

| | | |
|---|---|---|
| 3,385,773 A | 5/1968 | Frantzen ........................ 204/16 |
| 3,464,855 A | 9/1969 | Shaheen et al. ............. 117/212 |
| 5,198,389 A | 3/1993 | van der Putten et al. ... 437/190 |
| 5,240,879 A | 8/1993 | De Bruin ....................... 437/190 |
| 5,256,274 A | 10/1993 | Poris ............................. 205/123 |
| 5,308,796 A | 5/1994 | Feldman et al. .............. 437/200 |
| 5,549,808 A | 8/1996 | Farooq et al. ................ 205/123 |
| 5,933,758 A | * 8/1999 | Jain ............................... 438/687 |
| 6,071,814 A | * 6/2000 | Jang .............................. 438/687 |

OTHER PUBLICATIONS

Electroless Plating for Low–Cost High–Leverage Wiring, IBM Technical Disclosure Bulletin, vol. 32 No. 3A, Aug. 1989.

* cited by examiner

Primary Examiner—Kathryn Gorgos
Assistant Examiner—Thao Tran
(74) Attorney, Agent, or Firm—Jay H. Anderson; Joseph P. Abate

(57) ABSTRACT

A method is described for electroplating a metal structure in a feature formed in a substrate. A seed layer of the metal is deposited on the top surface and on the bottom and sidewalls of the feature. The seed layer is then selectively removed from the top surface, so that only a portion of the seed layer remains in the feature on at least the bottom thereof. The metal is then electroplated using this portion of the seed layer, so that the metal fills the feature. The removal of the seed layer from the top surface causes no electroplating to occur on the top surface.

15 Claims, 3 Drawing Sheets

SELECTIVE PLATING PROCESS

RELATED APPLICATIONS

This application is related to Application Ser. Nos. 09/567,467, 09/567,469 and 09/567,466, filed the same day as the present application. All of these related applications are assigned to the same assignee as the present application. The disclosures of all these related applications are incorporated herein by reference.

FIELD OF THE INVENTION

This invention relates to fabrication and packaging processes for semiconductor devices, and more particularly to electroplating processes for fabricating metal structures generally greater than 3 µm thick, especially thick lines of copper.

BACKGROUND OF THE INVENTION

Electroplating is a widely used process in semiconductor manufacturing. Unfortunately, electroplating is a cumbersome process when it is desired to fabricate large structures such as metal lines on the order of 5 µm, for RF applications or for inductors capable of high-Q oscillations.

A conventional electroplating process for a thick metal line is shown in FIGS. 1A–1C. A substrate (alternatively, an interlevel dielectric such as $SiO_2$) 10 has a feature 11 formed therein. A liner/adhesion promoter 12 for the plated line is deposited on the surface, including the sidewalls and bottom of feature 11. In the case of copper electroplating, layer 12 is typically a combination of tantalum nitride (in contact with the substrate 10) and tantalum; layer 12 serves as a copper diffusion barrier while promoting adhesion to the substrate.

As shown in FIG. 1A, a seed layer 13 for the metal to be plated is deposited over the entire surface. Plating is then performed on the entire surface, until feature 11 is filled in with plated metal 14 (see FIG. 1B). To ensure that the entire feature is filled in, plating continues until an excess of plated metal appears in areas 15 outside feature 11. This excess (sometimes called overburden) must then be removed with a planarization process such as chemical-mechanical polishing (CMP), to finally yield a thick metal line as shown in FIG. 1C. The amount of necessary overburden depends on the size of the metal line being fabricated. If a variety of feature sizes are being plated, plating must continue until the largest feature is filled in, while smaller features are substantially overplated. This process is costly in terms of both time and materials; most of the plated metal 14 must be removed, and the planarization process is time-consuming.

Accordingly, there is a need for an improved electroplating process in which overburden is reduced or eliminated, so that the subsequent planarization process is shortened or avoided.

SUMMARY OF THE INVENTION

The present invention addresses the above-described need by providing a method of electroplating a metal structure in a feature formed in a substrate, such that no electroplating occurs in areas outside the feature where plating is desired. This is done by depositing a seed layer of the metal on the top surface of the substrate and the bottom and sidewalls of the feature, and then selectively removing the seed layer from at least the top surface. The seed layer is thus reduced to a portion in the feature (on at least the bottom thereof). The metal is then electroplated using that portion of the seed layer, so that the metal fills the feature.

The substrate may have a liner covering the top surface and the bottom and sidewalls of the feature, so that the seed layer is deposited on the liner. After electroplating, the liner and the metal are planarized so that the liner is removed from the top surface of the substrate and the top surface of the plated metal is made substantially planar with the top surface of the substrate. The planarization is preferably performed using chemical-mechanical polishing (CMP).

The present invention may be advantageously practiced when electroplating copper, with a liner including tantalum and tantalum nitride.

According to one aspect of the invention, the seed layer is deposited on the liner (including on the top surface of the substrate and on the sidewalls and bottom of the feature), and then selectively removed from the liner on the top surface. This selective removal is performed by CMP of the seed layer. The liner on the top surface is thus exposed, and the seed layer is reduced to a portion in the feature on the sidewalls and on the bottom thereof. The metal is then electroplated using that portion of the seed layer, so that metal fills the feature; the removal of the seed layer from the top surface causes electroplating not to occur on the top surface, but only in the feature where plating is desired. The plated metal is then planarized (preferably by CMP) so that a top surface of the metal is planar with the liner exposed on the top surface. Finally, the plated metal and the liner on the top surface are planarized so that the liner is removed from the top surface of the substrate, and the top surface of the metal is substantially planar with the top surface of the substrate.

According to another aspect of the invention, the seed layer is selectively removed by using a self-aligned masking layer. After the liner is deposited on the substrate (including the top surface, and the sidewalls and bottom of the feature where plating is desired) and the seed layer is deposited on the liner, a masking layer is deposited on the seed layer. This masking layer (preferably an organic material, deposited by a spin coating process) is then selectively removed from the top surface and the upper portion of the sidewalls; the remaining portion of the masking layer masks the seed layer at the bottom of the feature and the lower portion of the sidewalls. The exposed portion of the seed layer is then removed. The remaining portion of the masking layer is then removed, so that the remaining portion of the seed layer is exposed. The metal is then electroplated using this portion of the seed layer, so that the metal fills the feature. The plating process may be controlled so that a top surface of the metal is substantially planar with the top surface of the substrate. The removal of the seed layer from the top surface causes electroplating not to occur on the top surface. Finally, the liner on the top surface is planarized (preferably by CMP) to remove the liner therefrom. Since the plating process is performed when the only remaining portion of the seed layer is inside the feature on the bottom and lower sidewalls thereof, the plated metal may be confined to the interior of the feature. Accordingly, the use of a self-aligned masking layer permits control of the plating process so that only one planarization is required.

DETAILED DESCRIPTION OF THE PREFERRED EMBODIMENTS

In the following descriptions of the preferred embodiments of the invention, steps in the fabrication of a thick Cu line embedded in a $SiO_2$ interlevel dielectric will be detailed. It will be appreciated that this is intended as an example only, and that the invention may be practiced with a variety of substrates and with any metal that can be electroplated.

First Embodiment
Seed Layer Polish

Figure 1A:
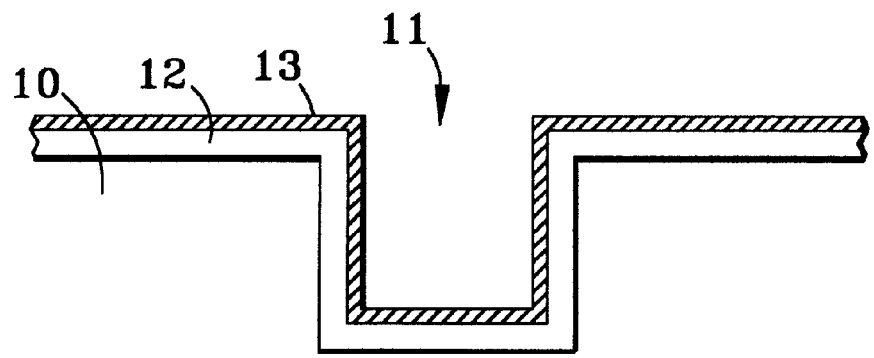
FIGS. 1A–1C illustrate steps in a conventional process for fabricating a thick metal line using electroplating.
Figure 1B:
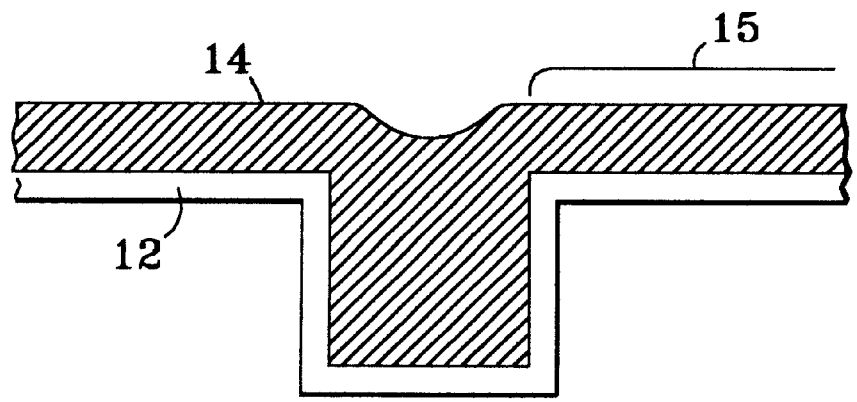
Figure 1C:
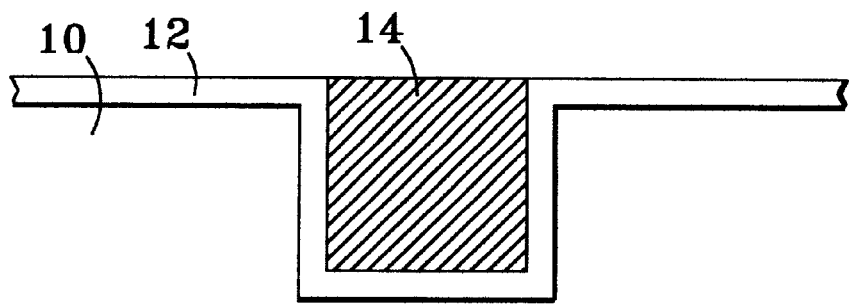
Figure 2A:
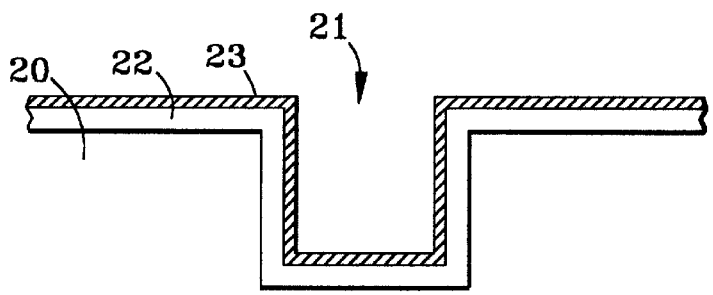
FIGS. 2A–2E illustrate steps in a selective plating process for fabricating a thick metal line, according to a first embodiment of the present invention.

As shown in FIG. 2A, dielectric layer 20 has a feature 21 formed therein, where the plated metal line is desired. A layer 22 of liner material is deposited on the entire surface, including the sidewalls and bottom of feature 21. As noted above, in the case of plating Cu this liner material is preferably a combination of TaN and Ta, with the TaN in contact with the layer 20; the liner serves as a diffusion barrier and an adhesion promoter. The seed layer 23 is then deposited over the liner, typically by chemical vapor deposition (CVD).

Figure 2B:
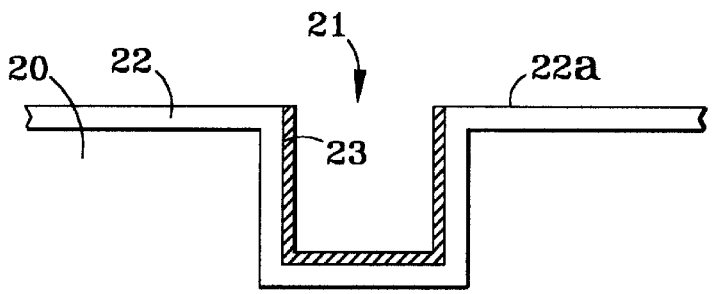

A planarization process, preferably CMP, is then performed to remove the seed layer from the top surface 22a of the liner 22. The resulting structure is shown in FIG. 2B. It should be noted that portions of the seed layer 23 remain on the sidewalls and bottom of feature 21. To avoid plating of unwanted metal on the top surface 22a, the seed layer 23 should be completely removed therefrom. If a CMP process is used, it is desirable at this point to clean the top surface and the interior of feature 21, to ensure that residues of polishing slurry are removed. In particular, an HF acid clean may be used with an alumina-based slurry.

Figure 2C:
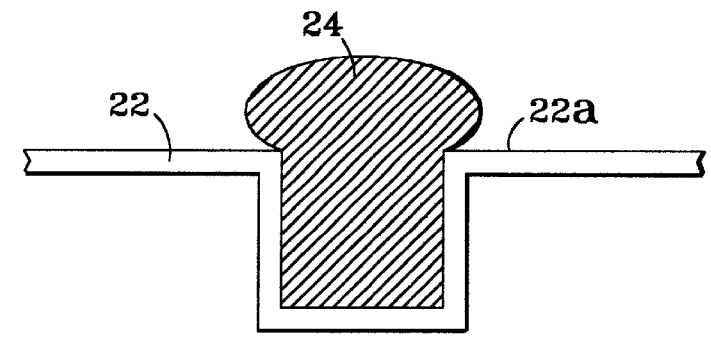
Figure 2D:
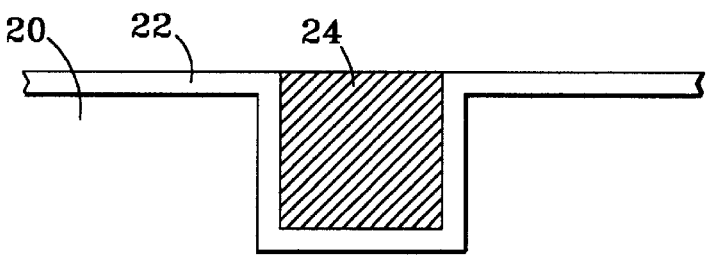
Figure 2E:
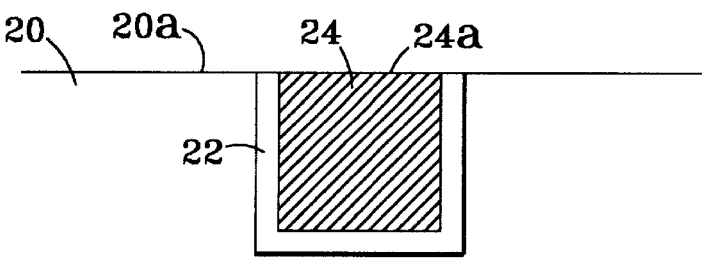

Electroplating is then performed using the seed layer 23. Since the seed layer is present only in the interior of feature 21, the plated metal 24 fills that feature but does not build up on the top surface 22a of the liner (see FIG. 2C). However, since plating occurs both inward from each sidewall and upward from the bottom of feature 21, some excess metal (often in a mushroom shape, as shown in FIG. 2C) appears above the plane defined by surface 22a. This excess is removed by planarizing the plated metal 24 back to the level of surface 22a, resulting in the structure shown in FIG. 2D. Finally, the exposed portion of layer 22 is removed so that the dielectric layer 20 is again exposed (see FIG. 2E). The liner material remains only where it is needed; that is, between the plated metal 24 and the dielectric layer 20. In this last planarization step, some of the metal 24 is also removed, typically at a rate different from the removal rate of the liner material. However, since the layer 22 is much thinner than the depth of the plated line (typically about 1000 Å compared with 5 $\mu$m), the top surface 24a of the plated line is still substantially planar with the top surface 20a of 30 the dielectric layer 20 at the end of the process.

Since the seed layer is removed from the top surface of the structure before plating, the conventional plating overburden is eliminated. The planarization process required to remove the overburden is thus avoided.

Second Embodiment:
Self-Aligned Masked Seed Layer

In this embodiment, an organic film is used as a self-aligned mask in a seed layer removal process, so that the seed layer is confined to the areas where plating is desired.

Figure 3A:
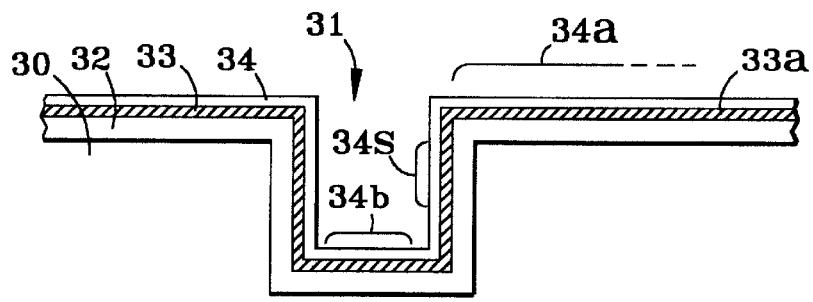
FIGS. 3A–3E illustrate steps in a selective plating process for fabricating a thick metal line, according to a second embodiment of the present invention.

To begin the fabrication process for a thick metal line in a dielectric layer 30, a structure is prepared as shown in FIG. 3A. As in the first embodiment, a liner 32 and seed layer 33 are deposited on the entire surface, including the sidewalls and bottom of feature 31 where plating is desired.

A thin organic layer 34 is then applied over the seed layer. This layer has a thickness in the range 300–900 Å. In general, photolithographic polymers and polymeric adhesion promoters are suitable organic materials. It should be noted that the organic layer covers the seed layer 33 on the interior surfaces of feature 31, as well as on the top surface 33a of the seed layer. The organic layer 34 is applied by spin coating; this results in the layer being thicker at the bottom of feature 31 than at other locations. As shown in FIG. 3A, the portion 34b at the bottom is thicker than the portion 34s on the sidewalls or the portion 34a on the top surface.

Figure 3B:
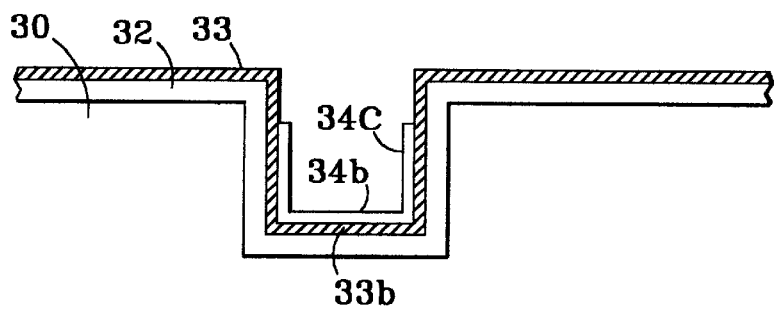

The organic layer 34 is then selectively removed, preferably by a directional RIE process; the relatively thin portion 34a is completely removed, while part of the relatively thick portion 34b remains, along with a portion 34c on the lower portion of the sidewalls. Alternatively, an ashing process with an oxygen plasma may be used to selectively remove the organic layer 34. The resulting structure is shown in FIG. 3B. The organic layer portions 34b and 34c thus form a self-aligned mask, covering the portions 33b and 33s of the seed layer on the bottom and sidewalls of feature 31. It will be appreciated that the amount of seed layer masked on the sidewalls (seed layer portion 33s) depends on the remaining amount of the organic layer on the sidewalls (organic layer portion 34c); this in turn depends on the duration of the RIE or ashing process used to selectively remove the organic layer.

Figure 3C:
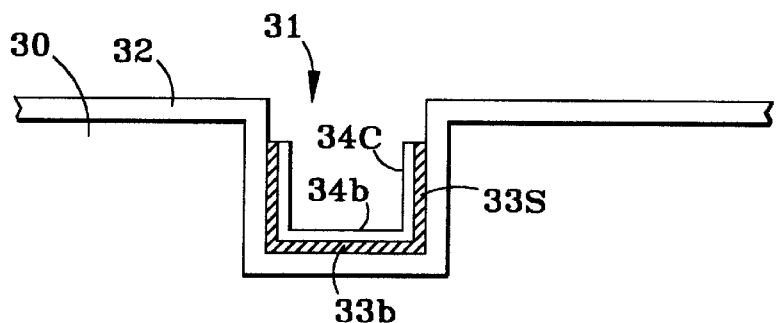

The seed layer is then removed (using any convenient process) from all areas not covered by the mask; the resulting structure is shown in FIG. 3C. The remaining portions 34b, 34c of the organic layer are then removed. The only remaining portions of the seed layer 33 are the portions 33s on the sidewalls of feature 31, and the portion 33b on the bottom. Accordingly, plating will occur only in the desired location.

Figure 3D:
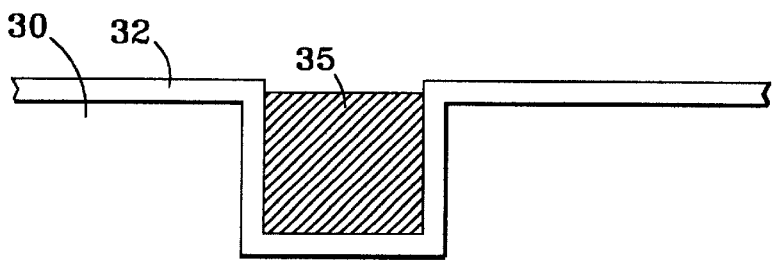

FIG. 3D shows the structure after electroplating is performed; the plated metal 35 fills the feature 31. The plating process may be controlled so that little or no overburden is required. As shown in FIG. 3D, plating may be halted before the top surface of metal 35 reaches the level of the top surface of layer 32. This process may be optimized by adjusting the amount of seed layer remaining in feature 31; as noted above, this may be done by adjusting the amount of mask removed from the sidewalls.

Figure 3E:
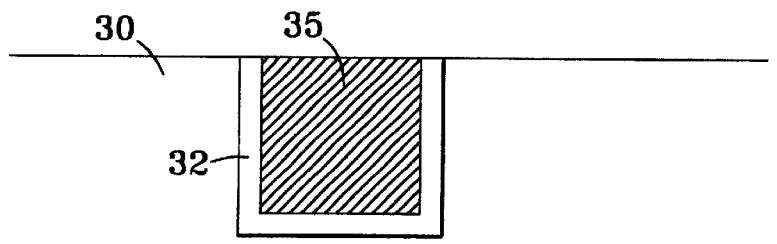

Finally, a planarizing process is performed as in the first embodiment, removing all exposed portions of layer 32 to again expose the top surface of dielectric layer 30 (see FIG. 3E). The top surface of metal 35 is then substantially planar with the top surface of layer 30. As in the first embodiment, the planarization process is preferably CMP. It should be noted that in this embodiment, overplating may be avoided so that only one planarization step is required. These advantages are realized by the use of the self-aligned organic mask.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method of electroplating a metal structure in a feature formed in a substrate, the substrate having a top surface, the feature having a bottom and sidewalls, the method comprising the steps of:

depositing a liner on the top surface, bottom and sidewalls;

depositing a seed layer of the metal on the liner;

planarizing the seed layer to remove the seed layer from the liner on the top surface, so that the liner on the top surface is exposed and the seed layer is reduced to a portion in the feature on the sidewalls and on the bottom thereof;

electroplating the metal using said portion of the seed layer and exposed portions thereof the liner, so that plated metal fills the feature, where the removal of the seed layer from the top surface causes no electroplating to occur on the top surface;

planarizing the plated metal so that a top surface of the metal is planar with the liner exposed on the top surface; and planarizing the plated metal and the liner on the top surface so that the liner is removed from the top surface of the substrate, and the top surface of the metal is substantially planar with the top surface of the substrate.

2. A method of electroplating a metal structure according to claim 1, wherein said planarizing steps are performed by chemical-mechanical polishing (CMP), and further comprising a step, after said step of planarizing the seed layer, of cleaning the liner exposed on the top surface and the portion of the seed layer in the feature.

3. A method of electroplating a metal structure according to claim 1, wherein the metal comprises copper.

4. A method of electroplating a metal structure according to claim 1, wherein the liner comprises tantalum and tantalum nitride.

5. A method of electroplating a metal structure in a feature formed in a substrate, the substrate having a top surface, the feature having a bottom and sidewalls, the method comprising the steps of:

depositing a liner on the top surface, bottom and sidewalls;

depositing a seed layer of the metal on the liner;

depositing a masking layer on the seed layer;

selectively removing the masking layer at least from the top surface, so that the seed layer has exposed portions at the top surface and is masked by a remaining portion of the masking layer at least at the bottom of the feature;

removing the exposed portions of the seed layer, so that the seed layer is reduced to a remaining portion at least on the bottom;

removing the remaining portion of the masking layer, thereby exposing said remaining portion of the seed layer;

electroplating the metal using said remaining portion of the seed layer and exposed portion of the liner, so that metal fills the feature, where the removal of the seed layer from the top surface causes no electroplating to occur on the top surface; and planarizing the liner on the top surface so that the liner is removed from the top surface of the substrate.

6. A method of electroplating a metal structure according to claim 5, wherein said planarizing step is performed using chemical-mechanical polishing (CMP).

7. A method of electroplating a metal structure according to claim 5, wherein the masking layer is of an organic material.

8. A method of electroplating a metal structure according to claim 7, wherein the masking layer has a thickness in the range 300 Å to 900 Å.

9. A method of electroplating a metal structure according to claim 7, wherein the organic material comprises a polymer.

10. A method of electroplating a metal structure according to claim 5, wherein said step of depositing the masking layer is performed by spin coating, so that the masking layer has a greater thickness at the bottom of the feature than on the top surface and on the sidewalls.

11. A method of electroplating a metal structure according to claim 5, wherein said step of selectively removing the masking layer comprises removing said layer at the top surface and at an upper portion of the sidewalls, with the remaining portion of said layer at a lower portion of the sidewalls and on the bottom.

12. A method of electroplating a metal structure according to claim 11, wherein in said step of selectively removing the masking layer, the remaining portion of the masking layer on the sidewalls is adjusted according to a duration of said step, thereby adjusting the remaining portion of the seed layer.

13. A method of electroplating a metal structure according to claim 5, wherein in said electroplating step, the metal fills the feature so that a top surface of the metal is substantially planar with the top surface of the substrate.

14. A method of electroplating a metal structure according to claim 5, wherein the metal comprises copper.

15. A method of electroplating a metal structure according to claim 5, wherein the liner comprises tantalum and tantalum nitride.

* * * * *